United States Patent [19]

Howe, Jr. et al.

[11] 4,165,490

[45] Aug. 21, 1979

[54] CLOCK PULSE GENERATOR WITH SELECTIVE PULSE DELAY AND PULSE WIDTH CONTROL

[75] Inventors: Leland D. Howe, Jr., Owego; Albert E. Paniccia, Binghamton; Vincent A. Scotto, Endicott, all of N.Y.

[73] Assignee: International Business Machines Corporation, Armonk, N.Y.

[21] Appl. No.: 861,755

[22] Filed: Dec. 19, 1977

[51] Int. Cl.² ............................................. H03K 1/18
[52] U.S. Cl. ...................................... 328/60; 328/55; 328/58; 328/63; 235/92 DE
[58] Field of Search ...................... 328/56, 55, 58, 63, 328/60, 62; 307/208, 269; 235/92 DE

[56] References Cited

U.S. PATENT DOCUMENTS

| | | | |
|---|---|---|---|
| 3,440,546 | 4/1969 | Nelson | 328/56 |
| 3,805,167 | 4/1974 | Nash et al. | 328/63 X |
| 3,883,867 | 5/1975 | Hatano et al. | 235/92 DE |
| 3,959,730 | 5/1976 | Weber et al. | 328/63 |
| 3,986,126 | 10/1976 | Gindi et al. | 307/269 X |
| 4,011,517 | 3/1977 | Pommerening et al. | 328/63 X |
| 4,101,761 | 7/1978 | Merryman | 328/63 X |

*Primary Examiner*—John S. Heyman
*Attorney, Agent, or Firm*—Donald F. Voss

[57] ABSTRACT

Clock generating apparatus for a computer system has selective pulse delay and pulse width control. Selection of pulse delay and pulse width is accomplished by loading registers with predetermined data patterns. The registers can be loaded under program control or by data entry units, such as a keyboard, switches, etc. The registers are located in coarse and fine pulse delay and pulse width adjustment units. These units have the same physical structure, but are functionally definable by a settable control element. A dither delay element is included in these coarse and fine adjustment units, and it is selectable to provide a small increment of delay. The coarse pulse delay and pulse width adjustment units also include pulse mode control circuitry to control operation in either normal oscillator mode or in single cycle mode.

11 Claims, 8 Drawing Figures

CLOCK PULSE GENERATOR WITH SELECTIVE PULSE DELAY AND PULSE WIDTH CONTROL

BACKGROUND OF THE INVENTION

1. Field of the Invention

This invention relates to clock pulse generating apparatus and, more particularly, to clock pulse generating apparatus for computer systems with selective pulse delay (skew) and pulse width control. The requirement for adjusting pulse width and skew is accentuated in computer systems constructed from large scale integrated (LSI) circuitry. This is because LSI circuits have looser tolerances on device parameters than other circuit technologies. Additionally, because of the mass number of circuits which can reside on a single chip, an entire logic path may be contained on the single chip. Thus, a given path may be slow on one chip and fast on another chip, or the path may shrink a pulse on one chip and expand the pulse on another. Further, there are pulse propagation delays, due to different cable and wire lengths and pulse width variations, because of circuit delays. Hence, by incorporating the present invention into a computer system, the ease of manufacture of the computer system is greatly enhanced. This is because of the need to tune each computer system as a step in the manufacturing process, and the present invention greatly facilitates this tuning. Also, after the computer system has been in use, it may be necessary to retune it, and the present invention facilitates this retuning.

2. Description of the Prior Art

Pulse delay and pulse width adjustment is well known in the prior art. Further, the prior art teaches apparatus for selecting the amount of delay; for example, the IBM Technical Disclosure Bulletin, Volume 15, Number 1, dated June, 1972, pages 252-254, sets forth an electronically adjustable computer clocking system where the amount of pulse delay is selectable. This prior art, however, does not teach selectable pulse width control whereby skew and pulse width can be automatically adjusted. U.S. Pat. No. 3,440,546, dated Apr. 22, 1969, entitled, "Variable Period and Pulse Width Delay Lined Pulse Generating System", sets forth pulse width control. However, such pulse width control operates in a different manner, i.e., the control is on the input to the delay element. The manner for selectively varying the pulse width is thus different. In the present invention, pulse width is controlled by use of logic elements and a control register, whereas in U.S. Pat. No. 3,440,546, pulse width is controlled by the switching of a bistable device from one state to another state. In that arrangement, the resolution is pulse width cannot be as accurate as in the present invention, because the switching time of the bistable devide has an affect on the pulse width.

In general, there are other clock pulse tuning systems, such as set forth in the IBM Technical Disclosure Bulletin, Volume 18, Number 6, dated November, 1975, pages 1912-1913, entitled, "Computer Clock Distribution System With Programmable Delay and Automatic Adjustment". However, the systems do not have selective pulse width adjustment. In the present invention, different pulses from the delay element are selected, and the selected pulses are combined by logic to provide skew and pulse width adjustment.

SUMMARY OF THE INVENTION

The principal objects of the invention are to provide improved pulse generating apparatus which: (a) has selective pulse delay and pulse width control; (b) utilizes a common circuit part selectively settable to be either a coarse or a fine pulse width and pulse delay adjustment unit; (c) includes pulse mode control in the coarse pulse width and pulse delay adjustment unit; (d) enables dynmaic adjustment of pulse delay and pulse width, without physically changing circuit connections and (e) provides skew and pulse width adjustment with a high degree of resolution.

These objectives are achieved by applying pulses from a free running oscillator to a delay element, such as a delay line. Pulses appearing at various taps on the delay line are applied to logic elements for both pulse delay adjustment and pulse width adjustment. These logic elements are conditioned by the outputs of decoders fed by contents of registers which are set with predetermined values. The outputs of the logic elements for the pulse delay and pulse width adjustment are logically combined to result in a pulse having the desired skew and pulse width adjustment. The values in the registers can be set therein under program control, or by manual entry devices, such as a keyboard, switches, etc. One computer system may require one set of values in the registers for its skew and pulse width adjustment, while another computer system might require a different set of values for skew and pulse width adjustment during the tuning of the computer system. The registers can be expanded so as to include a position for controlling whether an adjustment unit is to be a coarse adjustment unit or a fine adjustment unit. If the pulse delay and pulse width adjustment unit is controlled as a fine adjustment unit, the pulse mode control circuitry is not enabled. Thus, a single unit or part number can be used for a coarse or fine adjustment unit. The basic reason for having coarse and fine adjustment units is that the coarse adjustment unit provides extra drive capability for the oscillator.

DESCRIPTION OF THE DRAWINGS

FIG. 3 is a diagram illustrating the details of the fine adjustment unit of FIG. 1;

DESCRIPTION OF THE INVENTION

Figure 1:
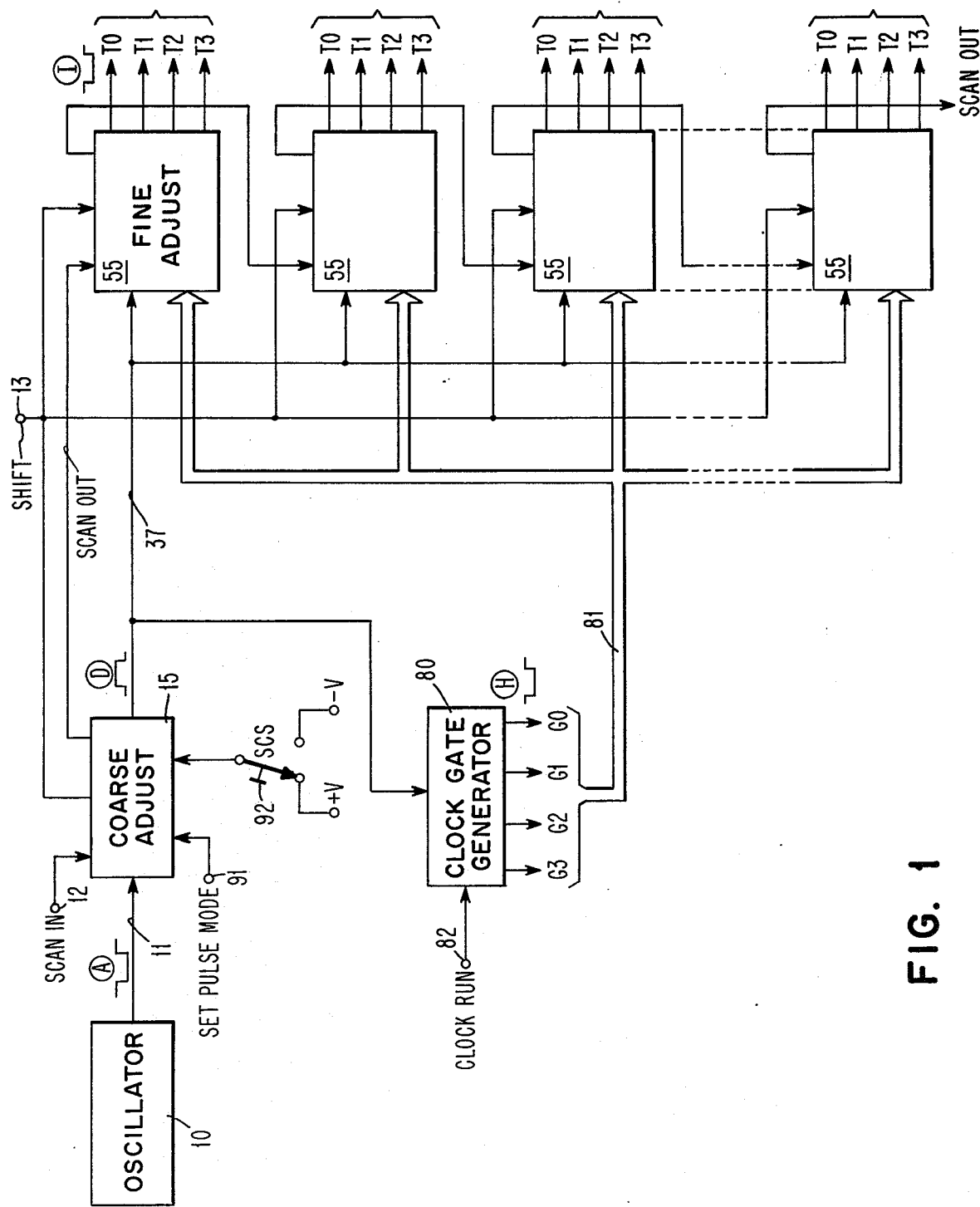
FIG. 1 is a block diagram illustrating the invention embodied to include a single coarse adjustment unit and a plurality of fine adjustment units having gated outputs.

With reference to drawings, and particularly to FIG. 1, the invention is illustrated by way of example as including an oscillator 10, which provides sequentially occurring pulses at a predetermined frequency. An oscillator pulse is illustrated by wave form A in FIG. 4. The oscillator pulses are applied over line 11 by a coarse adjustment unit 15. The function of the coarse adjustment unit 15 is to provide gross pulse skew and width adjustment for the pulses coming from oscillator 10. Coarse adjustment unit 15 does not change the repetition rate or frequency of the pulses emanating from oscillator 10.

The timing pulses from coarse adjustment unit 15 are applied over line 37 to fine adjustment units 55 and to clock gate generator 80. The present invention does not require both coarse and fine adjustment units, nor does it require a plurality of fine adjustment units. The use of both coarse and fine adjustment units, however, provides extra drive capability for the oscillator. Although a plurality of fine adjustment units may not be required, it is usually desirable to have different fine adjustment units for different functional units within a computer system. For example, one fine adjustment unit would provide timing pulses for the central processing unit, while another fine adjustment unit would provide timing pulses for storage, and still another fine adjustment unit would provide timing pulses for the channel.

Clock gate generator 80 uses the timing pulses from coarse adjustment unit 15 for generating gating pulses, which are applied over bus 81 to the fine adjustment units 55. Generally, in a computer system, it is desirable to provide gated clock pulses to the various functional units within the computer system. Normally, the running of the computer clock is controlled by a clock run signal. The clock run signal normally comes from control circuitry within the computer system, and is applied to the clock gate generator 80 via input terminal 82. The clock gate generator 80 can consist of latches or polarity hold circuits connected as a ring, and where the output from the last latch or polarity hold circuit is fed back to condition the first latch or polarity hold circuit in the ring. The clock run signal has a time duration to condition the setting of the first latch or polarity hold circuit, but terminates before the next pulse comes along for setting the next or second latch of the latch ring. The pulses for successively setting the latches or polarity hold circuits of the clock gate generator 80 are shown as coming from the coarse adjustment 15. These pulses, of course, could come from any one of the fine adjustment units 55 if a more precise clock gating signal were desired.

The scan-in and shift terminals 12 and 13 are used for setting data values into the coarse adjustment and fine adjustment units 15 and 55 in a manner to be described shortly. Pulses can also be generated in a single cycle mode. As will be seen later herein, in connection with the description of FIG. 5, whenever a minus level voltage is applied to terminal 91, the clock is inhibited; i.e., clock pulses are blocked from leaving the coarse adjustment unit 15. Single cycle operation is controlled by operating single cycle switch 92. Single cycle switch operation will be described in detail later herein.

Figure 2:
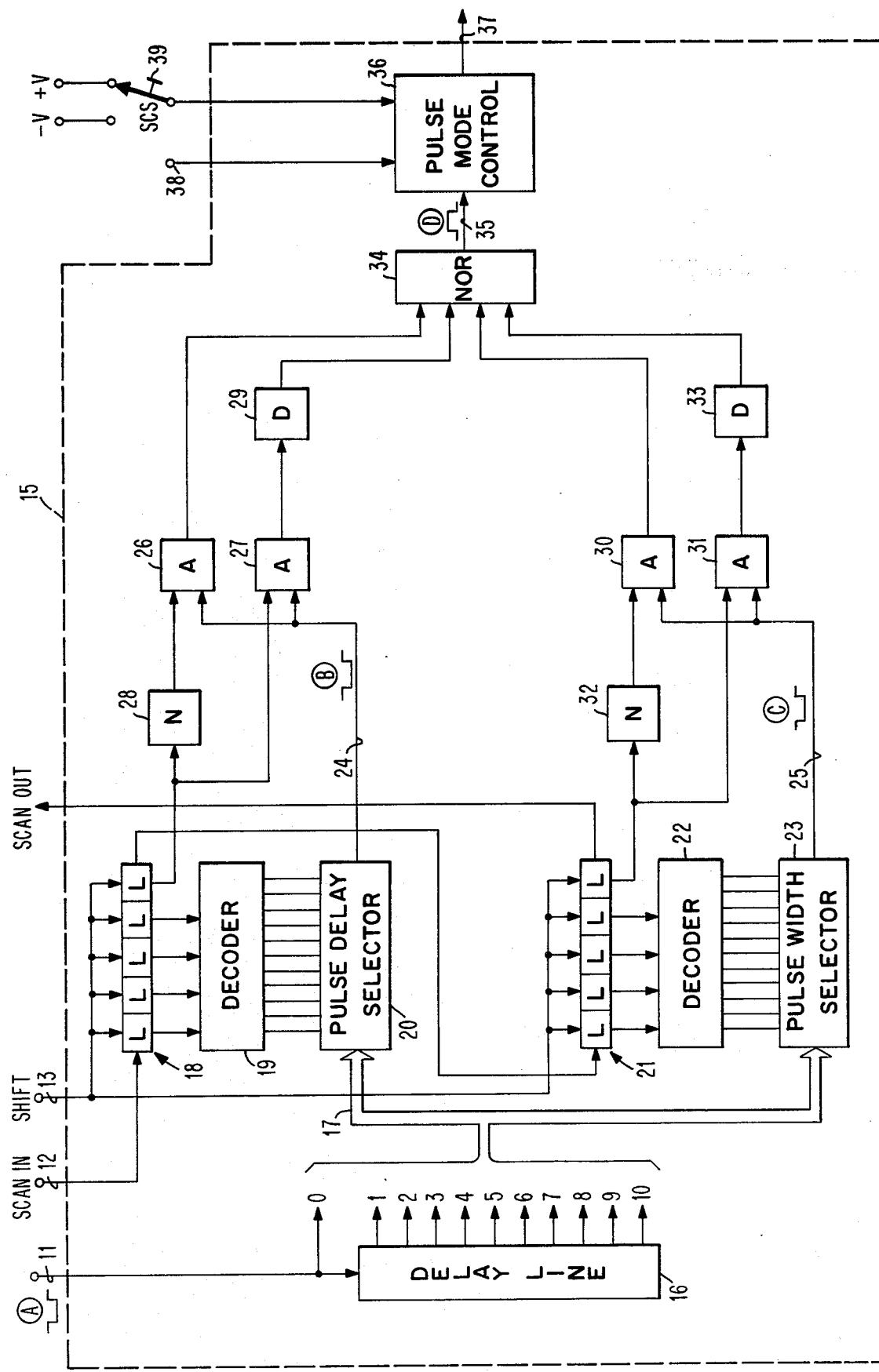

The coarse adjustment unit 15, FIG. 2, includes a delay line 16, which, in this example, has ten output taps. The pulses from oscillator 10 are applied to the input of delay line 16 via line 11. The output taps from delay line 16 provide pulses, spaced from each other a predetermined amount. For example, a 22 nanosecond delay line divided into ten taps provides a delay between pulses of 2.2 nanoseconds per tap. The outputs from delay line 16 and the pulses from line 11 are fed via bus 17 to pulse delay and pulse width selectors 20 and 23. Selectors 20 and 23, in this example, include eleven AND circuits, which are selectively conditioned by outputs from decoders 19 and 22, respectively. Decoders 19 and 22 have inputs from latch rings 18 and 21, respectively. Latch rings 18 and 21 can be constructed from conventional latches or from latches set forth in U.S. Pat. No. 3,806,891, dated Apr. 23, 1974, by Eichelberger, et al, for "Logic Circuit for Scan In/Scan Out". Latch rings 18 and 21 are essentially connected as one long shift register, where the output from the last latch in ring 18 is connected to the input of the first latch in ring 21. The output of the last latch in ring 21 is connected to the Scan Out line. The data pattern to be entered into latch rings 18 and 21 is serially applied to input terminal 12, and shift pulses for shifting the data into the latch rings are applied to terminal 13. The latches forming latch rings 18 and 21 can operate in both shift register and nonshift register modes.

Normally, in a computer system, the predetermined value to be entered into the latch rings 18 and 21 would be scanned into these latch rings during initial program load of the computer system. The values to be set therein, of course, are obtained by checking different points of the computer circuitry, such as by means of oscilliscope, to determine the amount of adjustment required. Once knowing the amount of adjustment required, the values for producing the required adjustment can be computed.

Pulse delay and pulse width selectors 20 and 23 each include, in this particular example, eleven AND circuits having inputs from the eleven taps of delay line 16, and conditioned by the eleven outputs of decoders 19 and 22, respectively. The values set into latch rings 18 and 21 will determine which of the AND circuits in selectors 20 and 23 are conditioned. The outputs of the AND circuits in selectors 20 and 23 feed OR circuits which provide outputs on lines 24 and 25, respectively. The output pulses appearing on lines 24 and 25 are represented by wave forms B and C, respectively, in FIG. 4. It should be noted that wave forms B and C are representitive only, and their occurrences in time depend upon the values in latch rings 18 and 21, respectively.

The pulse from pulse delay selector 20 is applied via line 24 to AND circuits 26 and 27. In a similar manner, the output of pulse width selector 23 is applied via line 25 to AND circuits 30 and 31. AND circuits 26 and 30 feed NOR circuit 34 directly, whereas AND circuits 27 and 31 feed NOR circuit 34 via dither-delay elemenets 29 and 33. These dither-delay elements have a delay of one nanosecond. The last latch in latch rings 18 and 21 determine whether or not the pulses from selectors 20 and 23 will pass through dither-delay elements 29 and 33, respectively. The output from the last latch in ring 18 is applied directly to AND circuit 27, and is applied to AND circuit 26 via inverter 28. Hence, if this latch is set to the zero state, AND circuit 26 is conditioned, and if set to the one state, AND circuit 27 is conditioned. In a similar manner, the output of the last latch in latch ring 21 is applied to AND circuit 30 via inverter 32 and directly to AND circuit 31.

NOR circuit 34 functions to logically combine the two input pulses that it receives. In this particular example, the input pulses are negative-going pulses, and thus, the output from NOR circuit 34 is a positive-going pulse on line 35, as indicated by wave form D, in FIG. 4. This positive-going pulse has a pulse width CW, which is equal to the time interval during which both of the two input pulses are negative. The coarse delay CD and the coarse pulse width CW for the coarse adjust output pulses are given by the following expressions:

$$CD = CH \times \Delta D \quad (1)$$

$$CW = (P/2) - \Delta D(CH - CL) \quad (2)$$

Where:
 CD = Coarse Adjust Delay
 CH = Tap Number of Higher Selected Delay Line Tap
 $\Delta$D = Time Delay Between Adjacent Delay Line Taps
 CW = Coarse Width
 P/2 = ½ of Oscillator Period
 CL = Tap Number of Lower Selected Delay Line Tap In FIG. 2, selector 20 selects the higher numbered tap of delay line 16, and selector 23 selects the lower numbered tap of that delay line. Hence, selector 20 is termed the pulse delay selector and selector 23 is the pulse width selector. Of course, the functions of selectors 20 and 23 could be reversed without affecting the output from the coarse adjust unit 15. The coarse adjust unit 15 functions to chop the clock pulses more than necessary, so as to provide clock pulse separation. As it will be seen shortly, the fine adjust units 55 expand the pulses from coarse adjust unit 15 to provide clock pulses with the desired skew and pulse width adjustment.

The pulse from NOR circuit 34 is applied via line 35 to pulse mode control circuit 36, which permits either normal operation or pulse mode operation. For normal operation, pulse mode control circuit 36 passes repetitive pulses appearing on line 35 to output line 37. Normal operation is controlled by leaving set pulse mode terminal 38 at a positive level. When terminal 38 is held at a negative level, operation takes place in a pulse mode. Pulse mode operation is used for diagnostic purposes. Pulse mode control circuit 36, when operating in the pulse mode, allows a single pulse on line 35 to pass to line 37, although repetitive pulses are applied via line 35 to the pulse mode control circuit 36. Hence, when terminal 38 is shifted to a negative level, pulse mode control 36 blocks pulses from transferring from line 35 to line 37. A single pulse can be transferred from line 35 to line 37 by operation of single cycle switch 39. In order for a pulse to pass from line 35 to line 37, single cycle switch 39, which is a push-button type of switch, must be depressed and then released.

Figure 5:
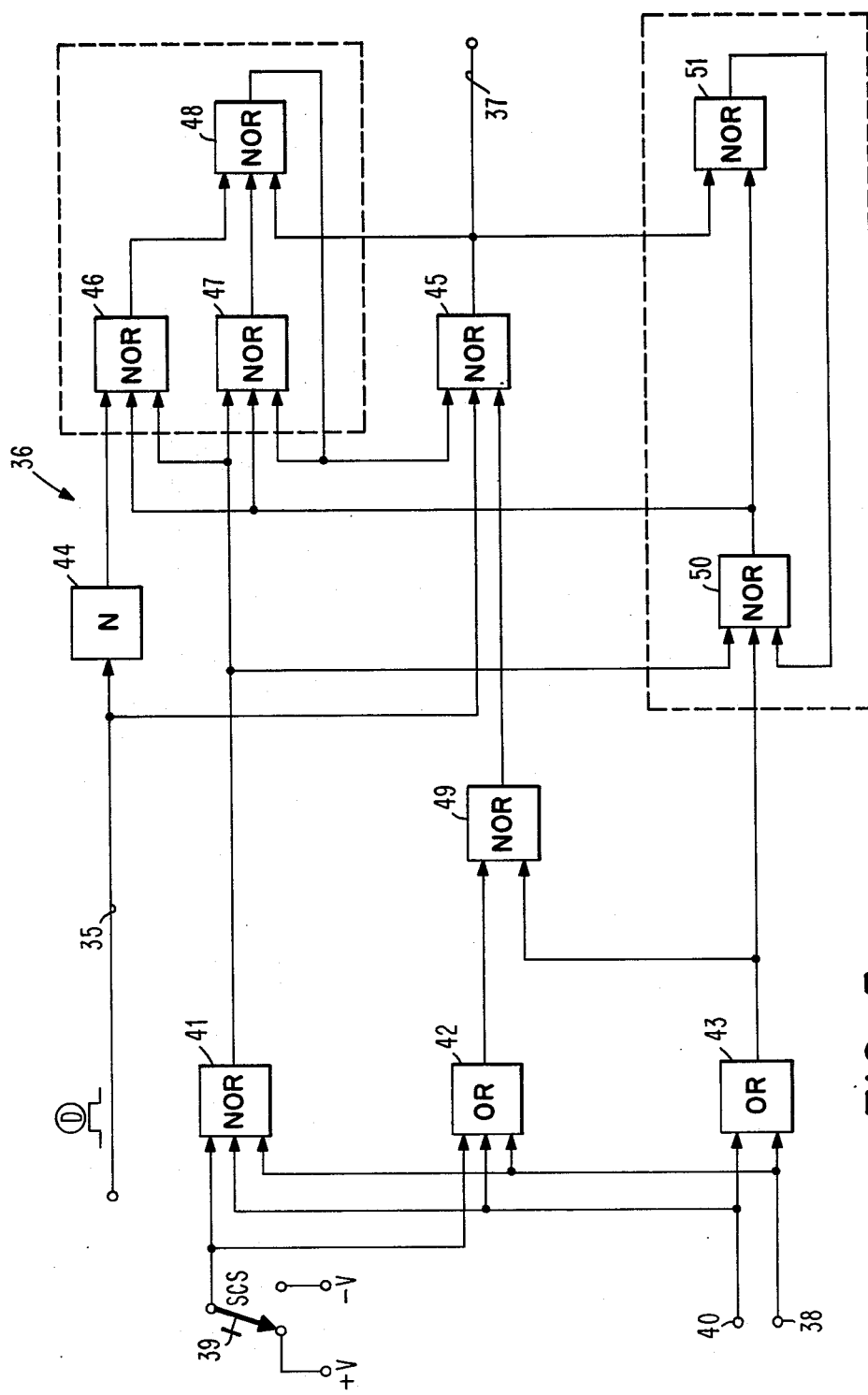
FIG. 5 is a logic diagram illustrating details of the pulse mode control circuit within the coarse adjustment unit of FIG. 2.

The details of the pulse mode control circuit 36 are shown in FIG. 5. As previously indicated, the voltage level of terminal 38 is held at a positive value for normal operation. Level control of terminal 38, of course, can be controlled by a switch or a program bit; i.e., when the program bit is in the one state, terminal 38 would be at a positive level and when in the zero state, terminal 38 would be at a negative level, or vice versa, the program bit states being a matter of choice. In this particular example, pulse mode circuit 36 also contains a chip select terminal which, as it will be seen later herein, permits a common part to be used for both a coarse or fine adjustment unit. The chip select terminal 40 is controlled by an additional scan ring position, which will be described in FIG. 7. Because the pulse adjust unit 15 of FIG. 2 is designated as a coarse adjust unit, the chip select scan ring position is not shown or required. In this instance, chip select 40 would be tied to a negative level.

Chip select terminal 40 feeds NOR circuit 41 and OR circuits 42 and 43, as does pulse mode terminal 38. The single cycle switch 39, which is at either a positive or negative level, feeds NOR circuit 41 and OR circuit 42. Pulses on line 35 are applied to inverter 44 and NOR circuit 45. The output of the inverter 44 changes repetitively with the repetitive pulses on line 35, and is applied to NOR circuit 46 which forms a latch with NOR circuits 47 and 48. The output of NOR circuit 48, in addition to feeding back to NOR circuit 47, feeds NOR circuit 45, which also has an input from NOR circuit 49. NOR circuit 49 receives inputs from OR circuits 42 and 43. NOR circuit 41 feeds NOR circuits 46, 47, and NOR circuit 50, which forms a latch with NOR circuit 51. NOR circuit 50 also has an input from OR circuit 43. NOR circuit 51, in addition to receiving an input from NOR circuit 50, has an input from NOR circuit 45, and the output of NOR circuit 51 feeds back to an input of NOR circuit 50. The output of NOR circuit 50 is also applied to inputs of NOR circuits 46 and 47.

When in the normal or run mode, pulse mode terminal 38 is at a positive voltage level, single cycle switch 39 is at a positive voltage level and chip select terminal 40 is at a negative voltage level. Thus, the output of NOR circuit 41 is at a negative level, and the outputs of OR circuits 42 and 43 are at positive levels. The output of NOR circuits 49 and 50 are at negative levels. The output of NOR circuit 46 is at a positive level when the input pulse is present, i.e., the output of inverter 44 is at a negative level and the other inputs from NOR circuits 41 and 50 are both at a negative level. The output of NOR circuit 48 will be at a negative level, and will be held at this negative level by the latch back path to NOR circuit 47, because the output of NOR circuit 47 is a positive level, in that all of its inputs are at negative levels. Thus, NOR circuit 45 will have its inputs from NOR circuits 48 and 49 at negative levels, and the input from line 35 will switch levels in accordance with the pulses appearing thereon. Thus, the output of NOR circuit 45 will be at a negative level when the pulse is present, and at a positive level when the pulse is absent. The output of NOR circuit 51 is immaterial during normal mode operation.

When in the single cycle mode, pulse mode terminal 38 and select terminal 40 are at a negative level. Further, assuming that single cycle switch 39 is not pressed, the output of NOR circuit 41 is at a negative level. The output of OR circuit 42 is at a positive level; however, the output of OR circuit 43 is at a negative level. Thus, the output of NOR circuit 49 is at a negative level. NOR circuit 50 has a positive output, and thus, the outputs of NOR circuits 46 and 47 are at a negative level.

When the pulse on Line 35 goes negative, the output of NOR circuit 48 stays positive, and the output of NOR circuits 45 and 51 stay negative. Therefore, the latch formed by NOR circuits 50 and 51 stays in the same state. Then, the output on line 37 remains at the negative level. When the switch SCS 39 is operated, the output of NOR 41 switches to a positive level, and the output level of OR circuit 42 goes to a negative level. Thus, the output of NOR circuit 49 goes to a positive level, and the output of NOR circuit 50 goes to a negative level. The output of NOR circuit 45 remains at the negative level, and hence, although the output of NOR circuit 51 switches to a positive level, no pulse is passed to line 37 because NOR circuit 45 remains at the negative level.

The output of NOR circuit 48 is at a positive level. Then, upon release of the switch SCS 39, the output of NOR circuit 41 goes to a negative level, and the output of OR 42 returns to the positive level. The output of OR circuit 43 remains at the negative level. The output of NOR circuit 49 goes to a negative level, and the output of NOR circuit 50 remains at the negative level. The output of NOR circuit 46 is dependent upon the level passed by inverter 44. When the pulse on line 35 is at a positive level, the output of NOR circuit 46 goes positive. This causes the output of NOR circuit 48 to go to a negative level. The output of NOR circuit 45 remains at the negative level, but when the pulse on line 35 goes to a negative level, the output of NOR circuit 45 goes to a positive level. The output of NOR circuit 51 goes to a negative level, and the output of NOR circuit 50 goes to a positive level. Thus, a single clock pulse on line 35 is passed to the output line 37 by operation and release of the single cycle switch 39 when terminal 38 is at a negative level for pulse mode operation.

Figure 3:
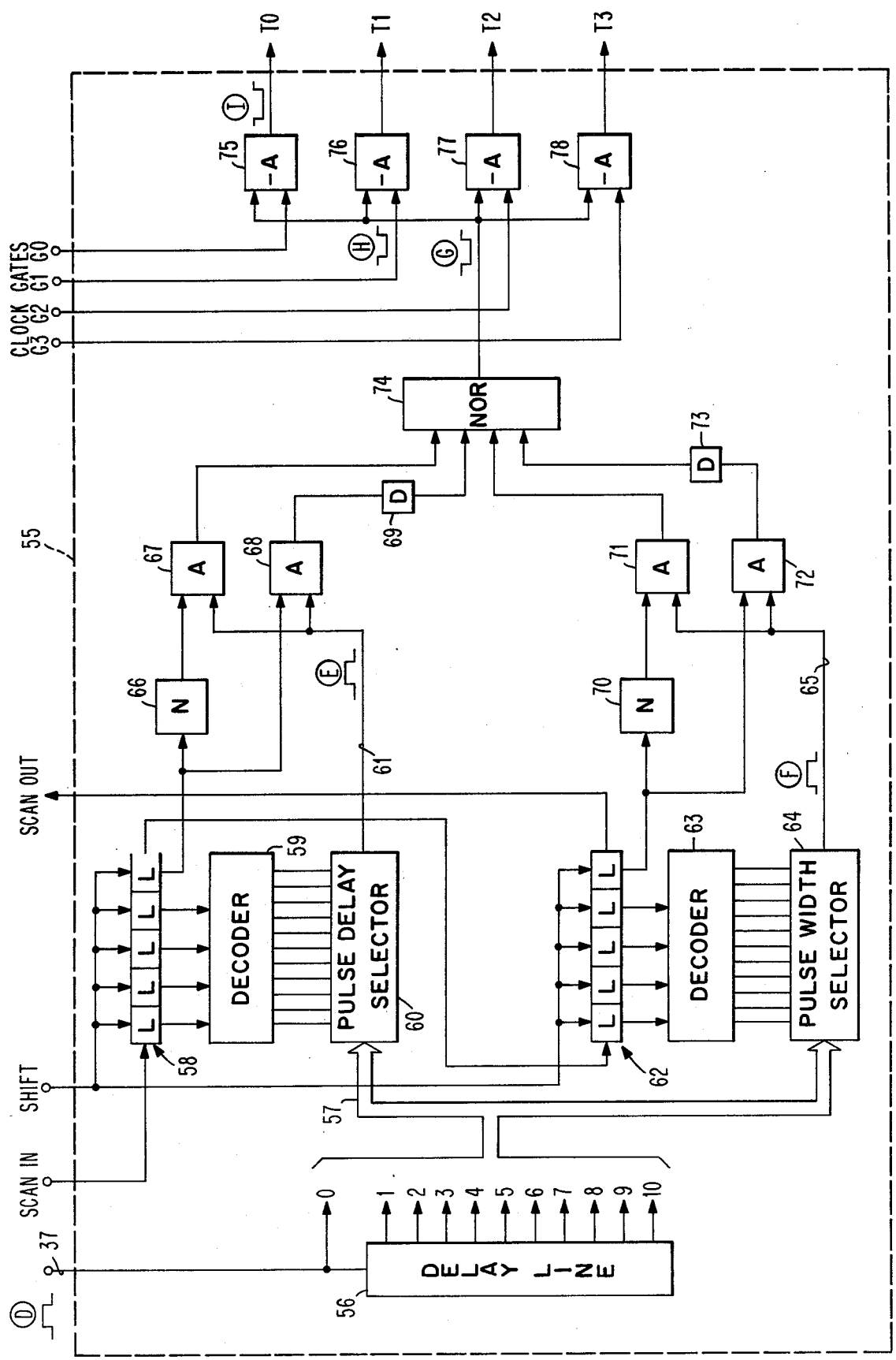
FIG. 3 is a diagram illustrating details of the coarse adjustment unit of FIG. 1.

The pulses appearing on line 37 are applied to fine adjust units 55. In this particular instance, the coarse adjust unit 15 has fifteen driver outputs, and thus, is able to drive fifteen fine adjust units 55. The pulses appearing on line 37 are applied to delay line 56 in each fine adjust unit 55 having detailed logic circuitry, as illustrated in FIG. 3. Delay line 56 is similar to delay line 16 of the coarse adjust unit 15, and has ten taps which, together with a tap taken from line 37, form bus 57, which feeds pulse delay selector 60 and pulse width selector 64. Pulse delay and pulse width selectors 60 and 64 have eleven AND circuits each, which have inputs from taps on delay line 56, and are conditioned by outputs of decoders 59 and 63, respectively. Decoders 59 and 63 are fed by outputs of scan rings 58 and 62. Scan rings 58 and 62 are similar to scan rings 18 and 21, and can be set with values in the same manner as previously described in connection with scan rings 18 and 21.

The last position of scan ring 58 feeds inverter 66 and AND circuit 68. The output of pulse delay selector 61 feeds AND circuits 67 and 68. The output of AND circuit 67 feeds NOR circuit 74 directly, whereas the output of AND circuit 68 feeds NOR circuit 74 via dither-delay 69. The pulse appearing at the output of selector 60 on line 61 is represented by wave form E in FIG. 4.

Pulse width selector 64 has eleven AND circuits, which are fed by bus 57, and these AND circuits are conditioned by the outputs of decoder 63. Decoder 63 is fed by outputs of scan ring 62. Pulse width selector 64 passes a pulse on line 65, which is represented by wave form F in FIG. 4. The pulses passed by pulse width selector 64 over line 65 are applied to AND circuits 71 and 72, which are conditioned by the last position of scan ring 62. AND circuit 71 is conditioned via inverter 70, and AND circuit 72 is conditioned directly from the last position of scan ring 62. The output of AND circuit 71 feeds NOR circuit 74, and the output of AND circuit 72 feeds NOR circuit 74 via dither-delay 73.

Figure 4:
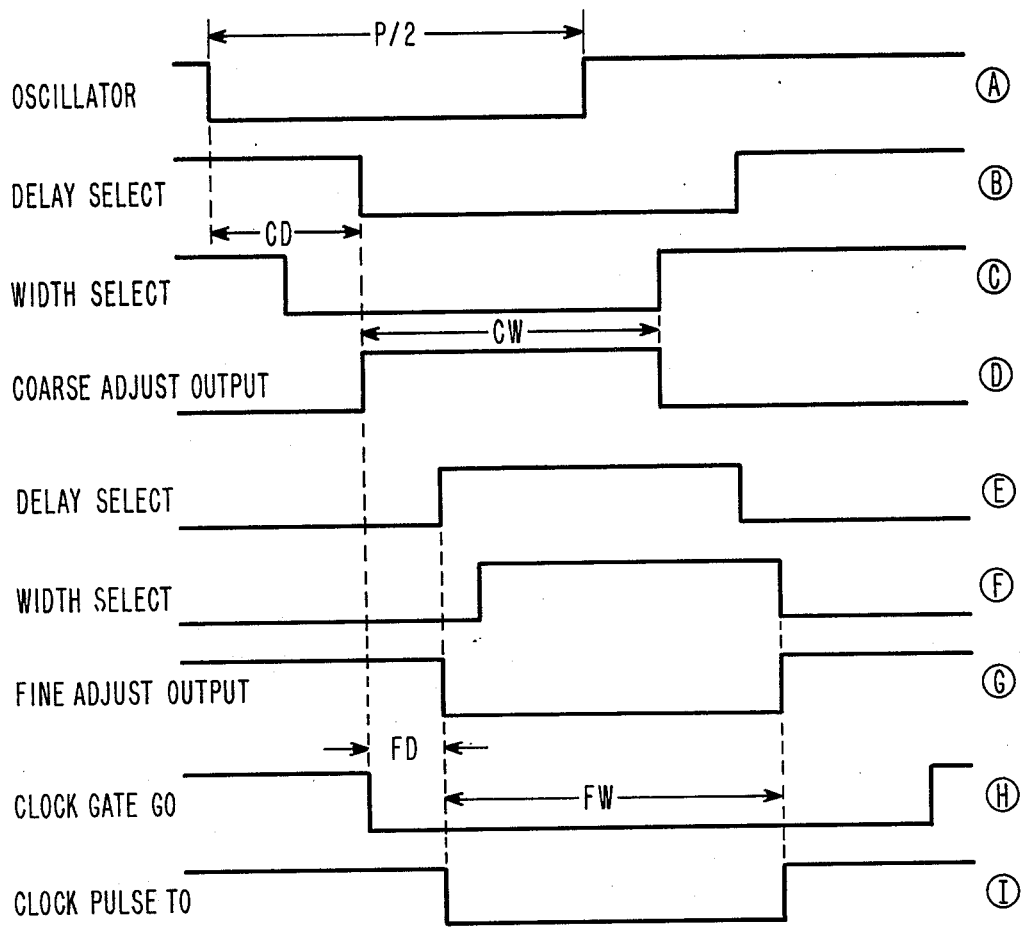
FIG. 4 is a timing diagram showing pulses at different points in FIG. 1.

It should be noted that the pulses represented by wave forms E and F are positive-going pulses, and thus, the NOR circuit 74 passes a negative-going pulse, as represented by wave form G in FIG. 4. The output of NOR circuit 74 is at a negative level during the time that either of the pulses on lines 61 or 65 are at a positive level. It is thus seen that the pulse represented by wave form G has a greater width than the pulse which is fed over line 37 to the fine adjust unit 55. Excluding the effect of the dither-delay circuits 69 and 73, the amount of fine delay FD and fine width FW adjustment provided by the fine adjust unit 55 are given by the following expressions:

$$FD = FL \times \Delta D \quad (3)$$

$$FW = CW + \Delta D(FH - FL) \quad (4)$$

Where:
FD = Fine Adjust Delay
FL = Tap Number of Lower Selected Delay Line Tap
$\Delta D$ = Time Delay Between Adjacent Delay Line Taps
FW = Fine Width
FH = Tap Number of Higher Select Delay Line Tap Thus, any difference in the delay line taps selected by selectors 60 and 64 functions to increase the width of the pulse appearing at the output of NOR circuit 74. The additional delay, which can be provided by each of the dither-delay circuits 69 and 73, is equal to one-half of $\Delta D$. In this particular example, the additional dither-delay is equal to one nanosecond. Thus, the fine delay or fine width can be additionally adjusted by one nanosecond.

The output of NOR circuit 74 feeds negative AND circuits 75, 76, 77 and 78. These negative AND circuits are conditioned by clock gates G0, G1, G2 and G3, respectively. The clock gates G0, G1, G2 and G3 are provided by the clock gate generator 80 in FIG. 1. Negative AND circuits 75, 76, 77 and 78 provide timing pulses T0, T1 T2 and T3, respectively, where timing pulse T0 is illustrated by wave form I, and is present when negative AND circuit 75 is conditioned by clock gate G0, represented by wave form H in FIG. 4. The width of clock gate G0 is selected so that it conditions associated negative AND circuit 75 for the range of different possible delayed positions of the pulses passed by NOR circuit 74. The clock gates G0-G3, inclusive, occur sequentially, and thus, the timing pulses T0-T3, occur sequentially.

Figure 6:
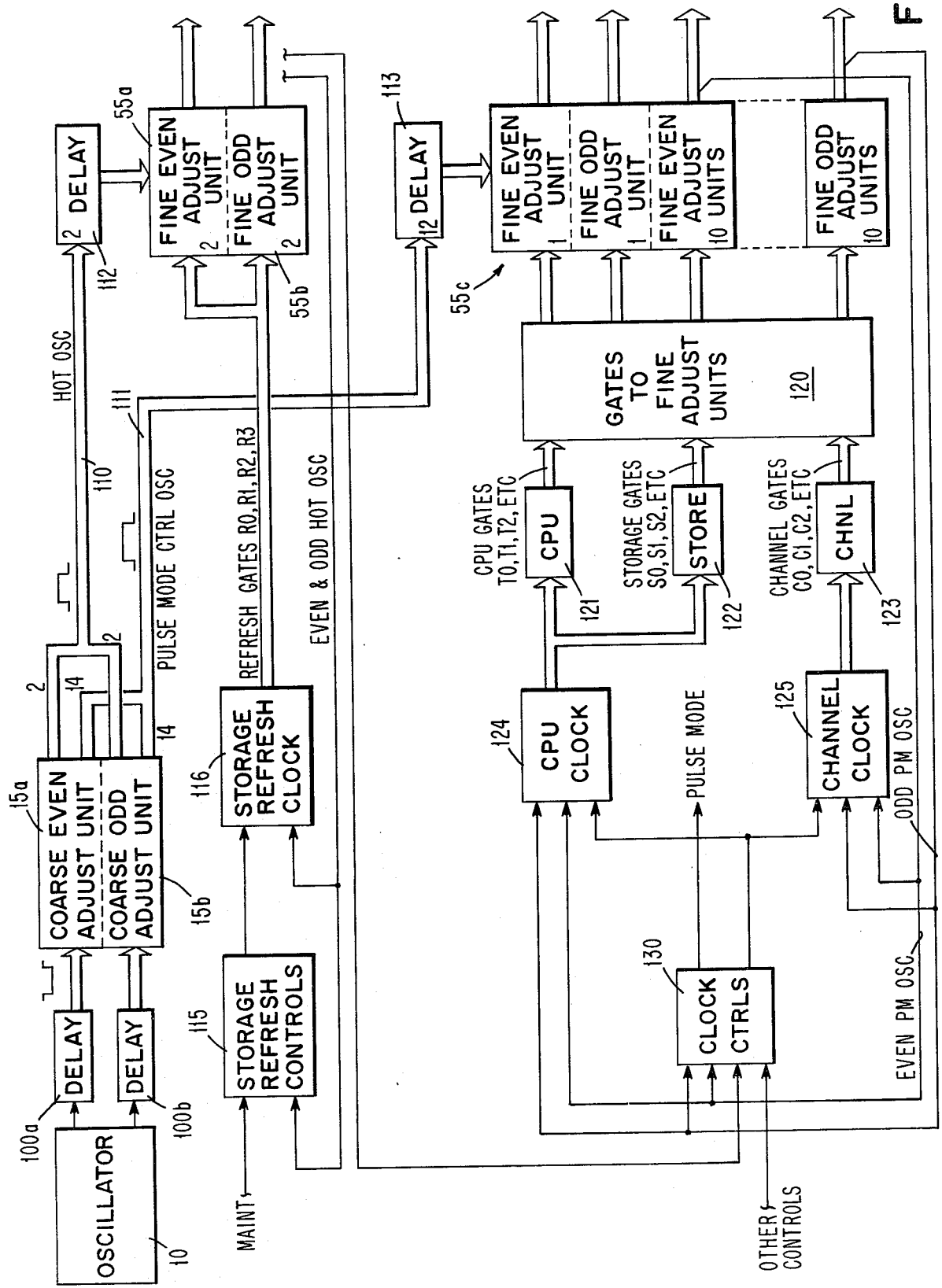
FIG. 6 is a block diagram illustrating the invention for generating in-phase and out-of-phase, or even and odd pulses, together with control circuitry for generating CPU, storage and channel gating signals.

In some computer systems, it is desirable to have a two-phase clock pulse generator, as set forth in FIG. 6. Oscillator 10, in FIG. 6, feeds delays 100a and 100b. Delays 100a and 100b function to adjust time delays due to wiring distance differences. Delays 100a and 100b feed the coarse even and coarse odd adjustment units 15a and 15b, respectively. Coarse even and coarse odd adjustment units 15a and 15b have two sets of outputs. One set of outputs includes two drivers which feed bus 110. The other set of outputs includes fourteen drivers which feed bus 111. Bus 110 feeds two delay elements represented by delay 112, and these two delay elements feed two fine adjust units 55a and 55b. The coarse adjust units 15a and 15b and the fine adjust units 55a and 55b have the structures of the coarse adjust unit 15 and the fine adjust unit 55 illustrated in FIGS. 2 and 3, respectively. The two drivers in coarse adjust units 15a and 15b which feed bus 110, however, provide adjusted pulses only in the normal and not in the pulse mode, because the pulses from fine adjust units 55a and 55b provide storage refresh timing pulses. The storage refresh timing pulses must occur continuously. The fine even and fine odd adjust units 55a and 55b are gated by clock gates from storage refresh clock ring 116, which is controlled by storage refresh controls 115.

The fourteen drivers feeding bus 111, which feeds twelve delay elements represented by delay 113, can pass coarse adjusted pulses in either normal or pulse mode. Delay elements 112 and 113 function to adjust out wiring distance differences and delays due to fine adjust chip differences. Delays 113 feed fine even and fine odd adjust units 55c. These fine even and fine odd adjust units are gated by gates from gate unit 120. Gate unit 120 has three types of gate inputs. Clock gate generator 124 provides CPU gates T0, T1, etc., via CPU gate control 121 and storage gates S0, S1, etc., via storage gate control 122. Clock gate generator 125 provides channel gates C0, C1, etc., via channel gate control 123. CPU clock ring counter 124 receives odd and even (pulse mode) pulses from the outputs of fine even and fine odd adjust unit 55c. CPU clock ring counter 124 also has an input from clock controls 130. It should be noted that clock controls 130 provide the pulse mode signal which is applied to the coarse even and coarse odd adjust units 15a and 15b, which feed bus 111. These particular coarse even and coarse odd adjust units can operate in the pulse mode. Clock controls 130 also provide a control signal to channel clock ring counter 125. Clock controls 130 have additional control inputs which are not pertinent to the present invention. These additional inputs are labeled "Other CTRLS". Clock controls 130 also receive storage refresh timing pulses on line 131 for synchronization purposes.

Figure 7:
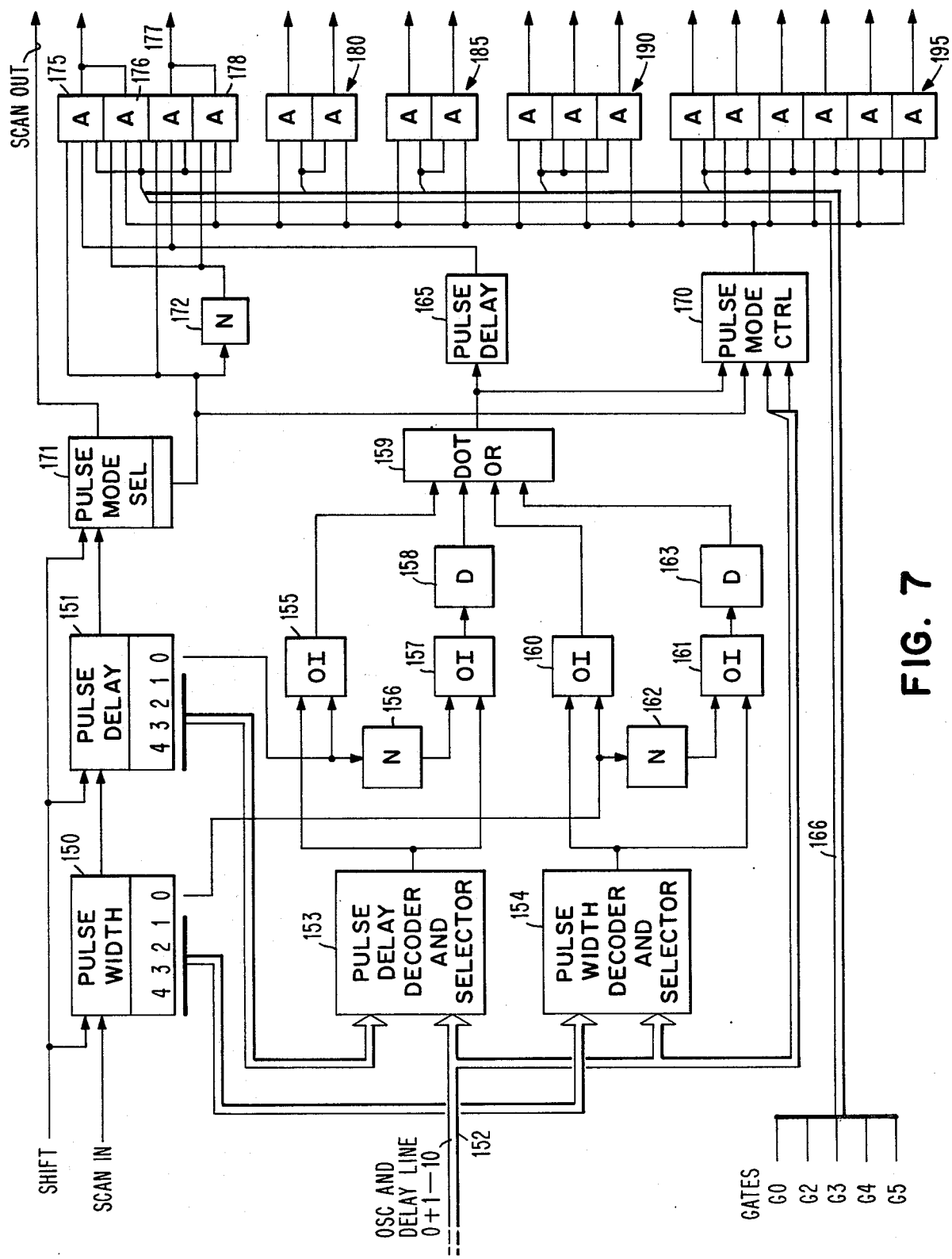
FIG. 7 is a block diagram illustrating the invention incorporated on a LSI chip, where the oscillator and the delay line are located off-chip; and, FIG. 8 is a timing diagram illustrating how a timing pulse can be adjusted by the present invention for different functional units within a computer system.

The present invention can be implemented in large scale integration (LSI) technology. A pulse width and pulse delay adjust unit is shown in FIG. 7 as being incorporated in a single LSI chip. This pulse delay and pulse width adjust chip has pulse width and pulse delay scan rings 150 and 151. These scan rings have the same function as the scan rings described in connection with the coarse adjust unit 15 of FIG. 2 and the fine adjust unit 55 of FIG. 3. The oscillator and delay lines are located off-chip, and thus, are not shown in FIG. 7. The eleven signals from the oscillator and delay line, not shown, are transmitted via bus 152 to pulse delay decoder and selector circuit 153, and to pulse width decoder and selector circuit 154. The pulse delay and pulse width decoder and selector circuits 153 and 154 contain AND circuits having inputs from bus 152, and inputs from scan rings 150 and 151. In other words, pulse delay decoder and selector circuit 153 performs the same function as decoder 19, and pulse delay selector 20 of FIG. 2 and decoder 59 and pulse delay selector 60 of FIG. 3. Similarly, pulse width decoder and selector circuit 154 performs the same function as decoder 22, and pulse width selector 23 of FIG. 2 and decoder 63 and pulse width selector 64 of FIG. 3. The output of pulse delay decoder and selector 153 is applied to OR invert circuits 155 and 157. OR invert circuit 155 is conditioned by the zero bit position of scan ring 151, and OR invert circuit 157 is conditioned by this bit position via inverter 156. OR invert circuit 157 feeds dither-delay 158, and the output of dither-delay 158 is applied, together with the output of OR invert circuit 155, to a DOT OR connection 159.

The output of pulse width decoder and selector circuit 154 is applied to OR invert circuits 160 and 161. OR invert circuit 160 is conditioned by the zero bit position of scan ring 150, and OR invert circuit 161 is conditioned by this bit position of scan ring 150 via inverter 162. The output of OR invert circuit 161 feeds dither-delay 163. The output of dither-delay 163 is applied, together with the output of OR invert circuit 160, to the DOT OR connection 159. The DOT OR connection 159 feeds pulse delay 165 and pulse mode control circuit 170.

Pulse mode control circuit 170 functions in the same manner as the pulse mode control circuit 36 of FIG. 2. Pulse mode control circuit 170 is rendered inoperative, however, if the adjust unit is to be a fine adjust unit. Latch 171 is connected to the last position of scan ring 151, and its output determines the operation of pulse mode control circuit 170. The output of latch 171 is connected to a terminal, not shown, in pulse mode control circuit 70, which has the same function as terminal 40 in FIG. 5. Hence, if latch 171 is set to the one state, pulse mode control circuit 170 could operate in the pulse mode, and the pulse delay and pulse width adjust chip becomes a fine adjust unit. On the other hand, if latch 171 is set to the zero state, pulse mode control circuit 170 can operate in the pulse mode, and the pulse delay and pulse width adjust unit becomes a coarse adjust unit. The state of latch 171, of course, is program settable, as are the states of latch rings 150 and 151. A scan-in operation, as previously described, is used to set the states of latch rings 150 and 151 and the state of latch 171. Pulse delay circuit 165 functions in a manner similar to the delay circuits 112 in FIG. 6.

The output of pulse delay circuit 165 is applied to AND circuits 175 and 177. These AND circuits are conditioned by the output of latch 171. Hence, there will be an output from AND circuits 175 and 177 only when latch 171 is set to the one state. It should also be noted that latches 175 and 177 are conditioned by gating pulses applied over bus 166. The output of pulse mode control circuit 170 is applied to AND circuits 176 and 178, and to groups of AND circuits 180, 185, 190 and 195. AND circuits 176 and 178 are conditioned by the output of latch 171 via inverter 172. Hence, AND circuits 176 and 178 pass pulses from pulse mode control circuit 170 when latch 171 is set to the zero state. AND circuits 176 and 178, as well as the groups of AND circuits 180, 185, 190 and 195, are conditioned by the gating signals transmitted over bus 166. In this particular example, AND circuits 175, 176, 177 and 178 are conditioned by a gate G5 signal. The groups of AND circuits 180, 185, 190 and 195 are conditioned by gate G4, gate G3, gate G2 and gate G0 signals, respectively.

Figure 8:
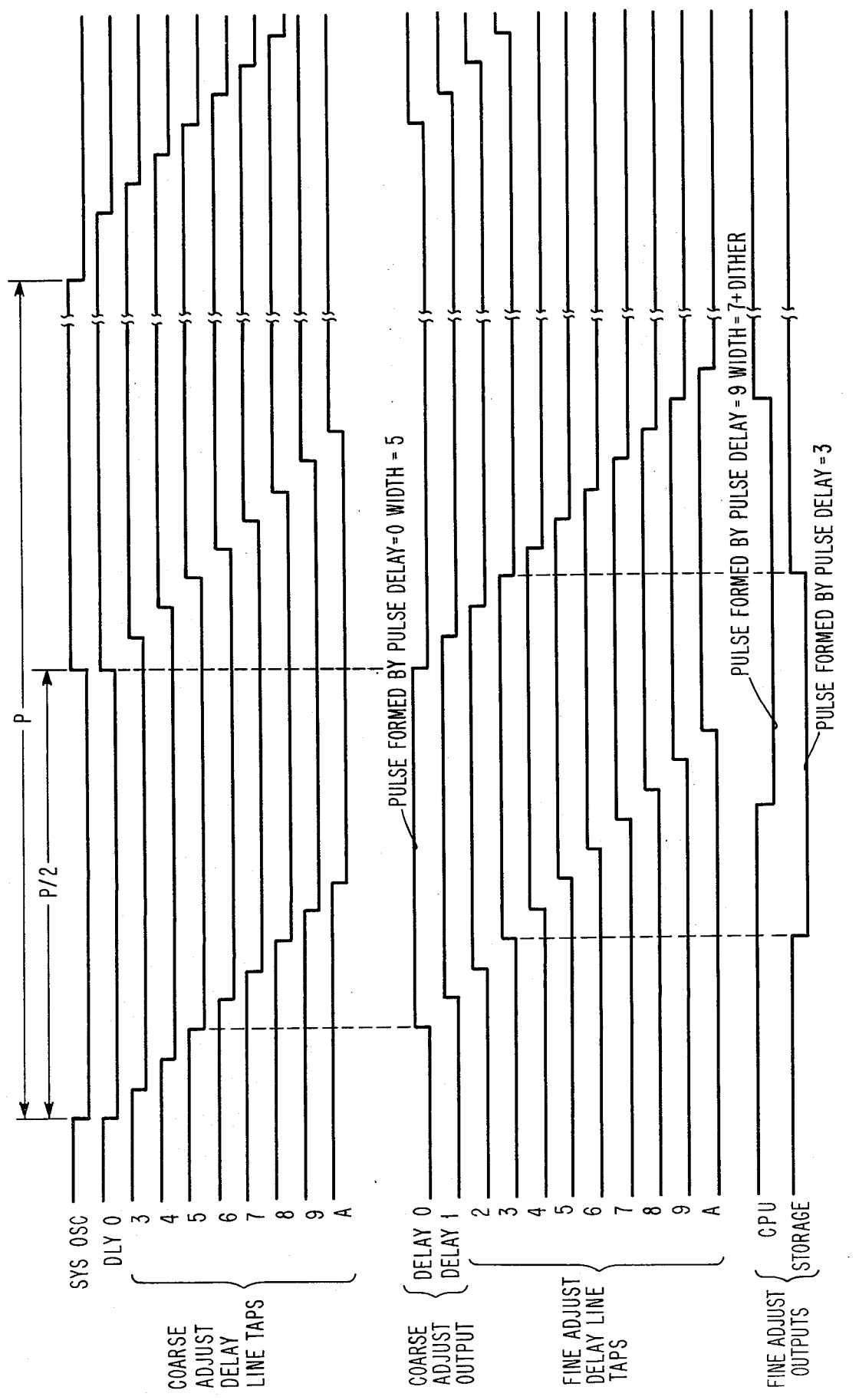

FIG. 8 illustrates the formation of a timing pulse which has been coarse adjusted by a pulse delay of zero and a pulse width of 5, and fine adjusted with a pulse delay of 9 and a pulse width of 7, plus a dither-delay. This timing pulse is illustrated as being adjusted for the central processing unit, as contrasted to a timing pulse adjusted for storage. The timing pulse adjusted for storage has the same coarse adjustment as the pulse for the CPU, but has a fine adjustment with a delay of 3.

From the foregoing, it is seen that the invention provides an improved pulse generating apparatus which has selective pulse delay and pulse width control. Further, it is seen that the invention enables dynamic adjustment of pulse delay and pulse width without physically changing circuit connections. It is also seen that the invention provides skew and pulse width adjustment with a high degree of resolution. The invention includes pulse mode control in the coarse pulse width and pulse delay adjustment unit. It is also seen that the invention can utilize a common circuit part selectively settable to be either a coarse or a fine pulse width and pulse delay adjustment unit.

What is claimed is:

1. Clock pulse generating apparatus for a computer system, including means for providing a series of repetitive clock pulses, the improvement comprising:

delay circuit means for providing a set of delayed pulses from each pulse of said series of repetitive pulses, first selector means connected to said delay circuit means to receive said set of delayed pulses, and having a number of selectively operable control elements equal to the number of delayed pulses in said set, each control element having an input connected to receive one delayed pulse of said set of delayed pulses, an output and a control input which upon being energized passes said one delayed pulse to said output, said output of each control element being commonly connected to an output of said first selector means, second selector means connected to said delay circuit means to receive said set of delayed pulses, and having a number of selectively operable control elements equal to the number of delayed pulses in said set, each control element having an input connected to receive one delayed pulse of said set of delayed pulses, an output and a control input which upon being energized passes said one delayed pulse to said output, said output of each control element being commonly connected to an output of said second selector means, logic circuit means for generating pulses formed from pulses from said first and second selector means, and selectively settable means for energizing the input of one control element of said first selector means and the input of one control element of said second selector means, whereby the pulses generated by said logic circuit means depends upon which control elements of said first and second selector means are energized.

2. The clock pulse generating apparatus of claim 1, wherein the pulse generated by said logic circuit means has a pulse width less than the pulse width of pulses from said first and second selector means.

3. The clock pulse generating apparatus of claim 1, wherein the pulse generated by said logic circuit means has a pulse width greater than the pulse width of pulses from said first and second selector means.

4. The clock pulse generating apparatus of claim 1, further comprising:

pulse mode control means connected to said logic circuit means and selectively operable in one mode to pass repetitive pulses generated by said logic circuit means and selectively operable in another mode to pass only a single pulse of said repetitive pulses generated by said logic circuit means, and means for controlling selective operation of said mode control means in said one and another modes.

5. The clock pulse generating apparatus of claim 4, wherein said means for controlling selective operation of said mode control means is a selectively settable binary element.

6. The clock pulse generating apparatus of claim 1, further comprising:

first dither-delay circuit means for delaying pulses from said first selector means less than the amount of delay between pulses of said set of delayed pulses before said pulses from said first selector means are applied to said logic circuit means, and selectively operable means for selectively applying delayed pulses from said first selector means to said first dither-delay means and for blocking pulses from passing directly from said first selector means to said logic circuit means.

7. The clock pulse generating apparatus of claim 6, further comprising:

second dither-delay circuit means for delaying pulses from said second selector means less than the amount of delay between pulses of said set of delayed pulses before said pulses from said second selector means are applied to said logic means, and selectively operable means for selectively applying delayed pulses from said second selector means to said second dither-delay means and for blocking pulses from passing directly from said first selector means to said logic circuit means.

8. Clock pulse delay and pulse width adjusting apparatus for adjusting pulse delay and pulse width of a series of repetitive clock pulses emanating from a source of clock pulses in a programmed computer system, the improvement comprising:

a delay line connected to receive said series of repetitive clock pulses, and having a set of outputs for providing a set of delayed clock pulses for each received clock pulse, pulse delay selector means connected to said delay line to receive said set of delayed clock pulses and selectively operable to pass only one delayed pulse of said set of delayed pulses, pulse width selector means connected to said delay line to receive said set of delayed clock pulses and selectively operable to pass only one delayed pulse of said set of delayed pulses, pulse delay scan ring means settable under program control for controlling selective operation of said pulse delay selector means, pulse width scan ring means settable under program control, for controlling selective operation of said pulse width selector means, first dither-delay circuit means for delaying pulses from said pulse delay selector means less than the amount of delay between pulses of said set of delayed pulses, second dither-delay circuit means for delaying pulses from said pulse width selector means less than the amount of delay between pulses of said set of delayed pulses, logic circuit means for forming adjusted pulses from pulses passed by said pulse delay and said pulse width selector means and said first and second dither-delay circuit means, first switch means connected to receive pulses from said pulse delay selector means and from said first dither-delay circuit means and selectively operable under control of said pulse delay scan ring means to pass either the pulse from said pulse delay selector means or the pulse from said first dither-delay circuit means to said logic circuit means, and second switch means connected to receive pulses from said pulse width selector means and from said second dither-delay circuit means and selectively operable under control of said pulse width scan ring means to pass either the pulse from said pulse width selector means or the pulse from said second dither-delay circuit means to said logic circuit means.

9. The clock pulse delay and pulse width adjusting apparatus of claim 8, further comprising:
pulse mode control means connected to said logic circuit means and selectively operable in one mode to pass repetitive pulses from said logic circuit means and selectively operable in another mode to pass only a single pulse of repetitive pulses from said logic circuit means, and
means for controlling selective operation of said mode control means in said one and another modes.

10. Clock pulse generating apparatus for a stored program computer system, including means for providing a series of repetitive clock pulses, the improvement comprising:
coarse pulse delay and pulse width adjusting means for adjusting the pulse delay and pulse width of said series of repetitive clock pulses, said coarse pulse delay and pulse width adjusting means comprising:
coarse delay circuit means for providing a set of delayed pulses from each pulse of said series of repetitive pulses,
coarse pulse delay selector means connected to receive said set of delayed pulses and having a number of selectively operable control elements equal in number to the number of delayed pulses in said set of delayed pulses, each control element having an input connected to receive one delayed pulse of said set of delayed pulses, an output and a control input which upon being energized passes said one delayed pulse to said output, said output of each control element being commonly connected to an output of said pulse delay selector means,
coarse pulse width selector means connected to receive said set of delayed pulses and having a number of selectively operable control elements equal in number to the number of delayed pulses in said set of delayed pulses, each control element having an input connected to receive one delayed pulse of said set of delayed pulses, an output and a control input which upon being energized passes said one delayed pulse to said output, said output of each control element being commonly connected to an output of said pulse width selected means,
coarse pulse delay scan ring means settable under program control for controlling selective energization of said control inputs of the control elements in said coarse pulse delay selector means, p1 coarse pulse width scan ring means settable under program control for controlling selective energization of said control inputs of said control elements in said coarse pulse width selector means, and
coarse logic circuit means for forming adjusted clock pulses from pulses passed by said coarse pulse delay and said coarse pulse width selector means,
fine pulse delay and pulse width adjustments for finely adjusting the pulse delay and pulse width of said series of repetitive clock pulses, said fine pulse delay and pulse width adjusting means comprising:
fine delay circuit means for providing a set of delayed pulses from each adjusted pulse formed by said logic circuit means of said coarse pulse delay and pulse width adjusting means,
fine pulse delay selector means connected to receive said set of delayed pulses and having a number of selectively operable control elements equal in number to the number of delayed pulses in said set of delayed pulses, each control element having an input connected to receive one delayed pulse of said set of delayed pulses, an output and a control input which upon being energized passes said one delayed pulse to said output, said output of each control element being commonly connected to an output of said pulse delay selector means,
fine pulse width selector means connected to receive said set of delayed pulses and having a number of selectively operable control elements equal in number to the number of delayed pulses in said set of delayed pulses, each control element having an input connected to receive one delayed pulse of said set of delayed pulses, an output and a control input which upon being energized passes said one delayed pulse to said output, said output of each control element being commonly connected to an output of said pulse width selector means,
fine pulse delay scan ring means settable under program control for controlling selective energization of said control inputs of said control elements in said fine pulse delay selector means,
fine pulse width scan ring means settable under program control for controlling selective energization of said control inputs of said control elements in said fine pulse width selector means, and
fine logic circuit means for forming adjusted pulses from pulses passed by said fine pulse delay and said fine pulse width selector means.

11. The clock pulse generating apparatus of claim 10, further comprising:
clock gate generator means for generating a series of sequentially occurring discrete clock pulses, and
a plurality of gates, with each gate having at least one input connected to receive adjusted pulses formed by said fine logic circuit means and one input connected to receive one clock gate of said discrete clock gates.

* * * * *